United States Patent
Doctor

(10) Patent No.: US 10,302,500 B2
(45) Date of Patent: May 28, 2019

(54) DIFFERENTIAL CIRCUIT FOR PYROELECTRIC INFRARED DETECTOR

(71) Applicant: Laser Components GmbH, Olching (DE)

(72) Inventor: Alan Doctor, Boynton Beach, FL (US)

(73) Assignee: Laser Components GmbH, Olching (DE)

( * ) Notice: Subject to any disclaimer, the term of this patent is extended or adjusted under 35 U.S.C. 154(b) by 72 days.

(21) Appl. No.: 15/556,041

(22) PCT Filed: Mar. 11, 2016

(86) PCT No.: PCT/EP2016/055275
§ 371 (c)(1),
(2) Date: Sep. 6, 2017

(87) PCT Pub. No.: WO2016/142512
PCT Pub. Date: Sep. 15, 2016

(65) Prior Publication Data
US 2018/0058937 A1    Mar. 1, 2018

Related U.S. Application Data

(60) Provisional application No. 62/132,008, filed on Mar. 12, 2015.

(51) Int. Cl.
*G01J 5/00*    (2006.01)
*G01J 5/34*    (2006.01)
(Continued)

(52) U.S. Cl.
CPC . *G01J 5/34* (2013.01); *G01J 1/44* (2013.01); *G01J 5/10* (2013.01); *G01J 5/24* (2013.01);
(Continued)

(58) Field of Classification Search
CPC ....... H01L 37/02; G08B 13/191; G08B 13/19; G01J 5/34; G01J 5/10; G01J 1/44; G01J 5/24; G01J 2001/444
See application file for complete search history.

(56) References Cited

U.S. PATENT DOCUMENTS 3,161,818 A * 12/1964 Britten ...................... H02P 9/34
                                                        322/28
3,453,432 A    7/1969 McHenry
(Continued)

FOREIGN PATENT DOCUMENTS

DE    19727447 A1    3/1998
EP    1156583 A2    11/2001
(Continued)

OTHER PUBLICATIONS

Anonymous, "Common drain", Wikipedia, Internet article, https://en.wikipedia.org/wiki/common_drain, XP55339824, (Nov. 20, 2013) (Rev. Oct. 31, 2015).

*Primary Examiner* — Kiho Kim
(74) *Attorney, Agent, or Firm* — McHale & Slavin, P.A.

(57) ABSTRACT

A differential pyroelectric infrared detector circuit formed by connecting a pyroelectric crystal to two separate impedance conversion circuits. The separate circuits derive two low impedance outputs which are connected to a differential or instrumentation amplifier. The circuit will eliminate electronic perturbations from outside sources such as line frequency interference or notice from an external but nearby oscillator which may be used to operate a microprocessor circuit, and other sources of electronic noise. The two outputs when connected differentially also have an output which is a factor of two greater than a normal standard single ended device, but also only produce noise which is only the square root of 2 or greater. The circuit additionally increased the signal to noise of the detector by a factor of the square (Continued)

root of the increase in signal or by about 1.41 times the standard single ended device.

4 Claims, 2 Drawing Sheets

(51) Int. Cl.
    *G08B 13/191*     (2006.01)
    *G01J 5/10*     (2006.01)
    *H01L 37/02*     (2006.01)
    *G08B 13/19*     (2006.01)
    *G01J 1/44*     (2006.01)
    *G01J 5/24*     (2006.01)

(52) U.S. Cl.
    CPC ........... *G08B 13/19* (2013.01); *G08B 13/191* (2013.01); *H01L 37/02* (2013.01); *G01J 2001/444* (2013.01)

(56) References Cited

U.S. PATENT DOCUMENTS

| | | | |
|---|---|---|---|
| 3,839,640 A | 10/1974 | Rossin | |
| 3,877,308 A | 4/1975 | Taylor | |
| 4,441,023 A * | 4/1984 | Doctor | G01J 5/34 250/338.3 |
| 7,253,411 B2 * | 8/2007 | Kaushal | H04N 5/33 250/332 |
| 8,946,538 B2 * | 2/2015 | Erbil | H01L 37/02 136/201 |
| 9,212,951 B2 * | 12/2015 | Fukui | G01J 1/44 |
| 2010/0044568 A1 * | 2/2010 | Ishii | G01J 5/34 250/338.3 |
| 2011/0057106 A1 * | 3/2011 | Kimura | G01J 1/46 250/338.3 |
| 2012/0228479 A1 * | 9/2012 | Chen | G03B 21/16 250/214 R |
| 2013/0282179 A1 | 4/2013 | Suguru | |
| 2013/0284903 A1 * | 10/2013 | Welch | H03F 1/34 250/214 A |
| 2014/0042320 A1 * | 2/2014 | Knaup | G01J 5/34 250/338.3 |
| 2014/0140112 A1 * | 5/2014 | Zhou | H02M 1/126 363/40 |
| 2016/0273959 A1 * | 9/2016 | Wang | H04B 10/6911 |
| 2016/0307438 A1 * | 10/2016 | Micko | G01B 11/00 |
| 2018/0058937 A1 * | 3/2018 | Doctor | G01J 1/44 |

FOREIGN PATENT DOCUMENTS

| | | |
|---|---|---|
| GB | 2278016 A | 11/1994 |
| WO | WO9944020 | 9/1999 |

* cited by examiner

डिFFERENTIAL CIRCUIT FOR
PYROELECTRIC INFRARED DETECTOR

CROSS REFERENCE TO RELATED
APPLICATIONS

This is a national stage filing in accordance with 35 U.S.C. § 371 of PCT/EP2016/055275, filed Mar. 11, 2016, which claims the benefit of the priority of U.S. Provisional Patent Application No. 62/132,008, filed Mar. 12, 2015, the contents of each are incorporated herein by reference.

FIELD OF THE INVENTION

This invention relates to the field of pyroelectric infrared detectors, and more particularly to a differential pyroelectric infrared detector circuit.

BACKGROUND OF THE INVENTION

Pyroelectric infrared detectors are used in many applications where background electronic noise can be a severe impediment to maximizing the performance of a system which utilizes these devices. The use of pyroelectric sensors using polarized crystals for detection of thermal radiation is well known. There have been many uses developed for such pyroelectric sensors. One important application is in the field of intruder alarms in which a pyroelectric sensor is arranged to detect the infrared radiation from a human being as an indication of an intruder. The invisible glow of materials permits pyroelectric infrared detectors to be used in detecting, monitoring, locating, counting and the like applications. Since every object is emitting infrared light, every object is a transmitter.

However, some pyroelectric infrared detectors can be falsely triggered by other sources of infrared radiation such as hot air from a heating system, sunlight, or equipment which may give off heat radiation. To discriminate between an element and such environmental effects, one method is to require movement of the source of heat. For this purpose, it is known to utilize at least two collocated sensors in a differential connection so as to produce zero net signal output when both sensors are irradiated and to produce multiple pulse outputs when a person walks past the device, as illustrated in U.S. Pat. No. 3,839,640 wherein two such sensors are connected in series opposition.

U.S. Pat. No. 4,441,023 discloses a compensated pyroelectric sensor having two separate but closely spaced lithium tantalate pyroelectric crystal detectors connected in parallel and poled such that output connections of opposite polarity are connected to each other. The dual sensor produces a much greater output voltage when one crystal is irradiated than would occur if the two detectors were connected series opposing.

It is also known in the prior art to connect two pyroelectric sensors in parallel opposition. Such connection will also reject signals produced by radiation common to both elements and has the advantage of a much higher sensitivity and output when only one sensor is energized. Such units also are free of the static build up problem. Typical of this type of device are the structures disclosed in U.S. Pat. Nos. 3,877,308 and 3,453,432 which disclose a pyroelectric radiation detector having at least two parallel opposed connected sensors.

Pyroelectric is the ability of certain materials to generate a temporary voltage when they are heated or cooled. The resulting polarization change gives rise to a voltage across the crystal. The crystal has a thermal time constant so it will thermalize to the ambient environment after a step input. The background noise can occur since pyroelectric infrared detectors require an impedance converting amplifier which is single ended wherein any electronic perturbation from an outside source such as line frequency interference or noise from an external but nearby oscillator which may be used to operate a microprocessor circuit or other sources of electronic noise can be coupled onto the detectors. Practical pyroelectrics contain either a JFET source follower in a voltage mode or a transimpedance amplifier in a current mode. The voltage mode circuit is known to generate the best signal to noise ratio. Other infrared detectors which do not require an impedance conversion circuit such as thermopiles are relatively low impedance devices are less sensitive to this problem.

SUMMARY OF THE INVENTION

An objective of the invention is to disclose a differential amplifier to determine a desired signal being the difference between two signals to reduce or eliminate background electronic noise.

Another objective of the invention is to disclose a differential pyroelectric infrared detector circuit comprising two separate impedance conversion circuits coupled to a pyroelectric crystal with each circuit providing a low impedance output and an amplifier for receipt of each.

Still another objective of the invention is to disclose a differential pyroelectric infrared detector circuit wherein two outputs when connected differentially have an output which is a factor of two greater than a conventional single ended device, wherein the two outputs produce noise which is only the square root of 2 greater.

Yet still another objective of the invention is to disclose a differential pyroelectric infrared detector circuit that increases signal noise of a detector by a factor of the square root of the increase in signal.

Still another objective of the invention is to disclose a differential pyroelectric infrared detector circuit that increases signal noise of a detector by about 1.41 times a conventional single ended device.

Other objectives and further advantages and benefits associated with this invention will be apparent to those skilled in the art from the description, examples and claims which follow.

These objectives are solved by means of a differential pyroelectric infrared detector circuit according to claim 1. Beneficial further developments and embodiments of the invention are given in the dependent claims.

The invention discloses a differential pyroelectric infrared detector formed by connecting a pyroelectric crystal to two separate impedance conversion circuits. The separate circuits derive two low impedance outputs which are then connected to a differential or instrumentation amplifier.

Thus, according to the invention the differential pyroelectric infrared detector circuit is comprising two separate impedance conversion circuits coupled to a pyroelectric crystal, each said circuit providing a low impedance output; and an amplifier for receipt of each said low impedance output.

It is advantageous, when each impedance conversion circuit is connected to one of one electrodes and the other to a counter electrode.

Preferably, the differential pyroelectric infrared detector circuit is comprising a first impedance conversion circuit and a second impedance conversion circuit coupled to a pyroelectric crystal, each said impedance conversation circuit formed from an amplifier providing a first and second low impedance output with a desired signal being the differential between said first and second low impedance output.

In this context it is beneficial when said amplifier is an impedance conversion amplifier.

Preferably, each of said amplifiers is a 2N4117 FET or equivalent impedance conversion amplifier.

Preferably, said two impedance conversion circuits are connected to a differential or instrumentation amplifier. Even more preferred is an embodiment wherein said two outputs when connected differentially have an output which is a factor of two greater than a conventional single ended device, wherein said two outputs produce noise which is only the square root of 2 greater.

Beneficially, the differential pyroelectric infrared detector circuit may be configured such that said first and second low impedance output are connected differentially to form an output which is a factor of two greater than a conventional single ended output, wherein said two low impedance outputs produce electrical noise being the square root of 2 greater.

Furthermore, the differential pyroelectric infrared detector circuit may be configured such that said circuit increases the electrical noise of a detector by a factor of the square root of the increase in signal.

In a preferred embodiment, the differential pyroelectric infrared detector circuit is configured such that said increase in signal to noise ratio of the detector is increased by about 1.41 times a conventional single ended device.

It is preferable if said first and second low impedance output being an increase in signal to noise ratio by about 1.41 times a conventional single ended device.

Moreover, it makes sense when he differential pyroelectric infrared detector circuit is configured such that said first and second low impedance output having a primary bridge formed by a first resistor R1 of about 1e11 Ohms and a second resistor R2 of about 1e11 Ohms coupled to a secondary bridge formed by a first resistor Rs1 of about 100 KOhms and second resistor Rs2 of about 100 KOhms.

In this context it makes sense when said primary bridge is coupled to the pyroelectric element output.

Moreover, said second bridge may be coupled to the amplifier output.

Finally, the differential pyroelectric infrared detector circuit can be configured such that each of said impedance conversation circuits is formed from an amplifier having a resistor bridge, each said resistor having a small capacitance of less than 5 pico Farad and a high ohmic value of resistance of about 100 Giga Ohms.

DETAILED DESCRIPTION OF THE PREFERRED EMBODIMENT

Detailed embodiments of the instant invention are disclosed herein, however, it is to be understood that the disclosed embodiments are merely exemplary of the invention, which may be embodied in various forms. Therefore, specific functional and structural details disclosed herein are not to be interpreted as limiting, but merely as a basis for the claims and as a representation basis for teaching one skilled in the art to variously employ the present invention in virtually any appropriately detailed structure.

Figure 1:
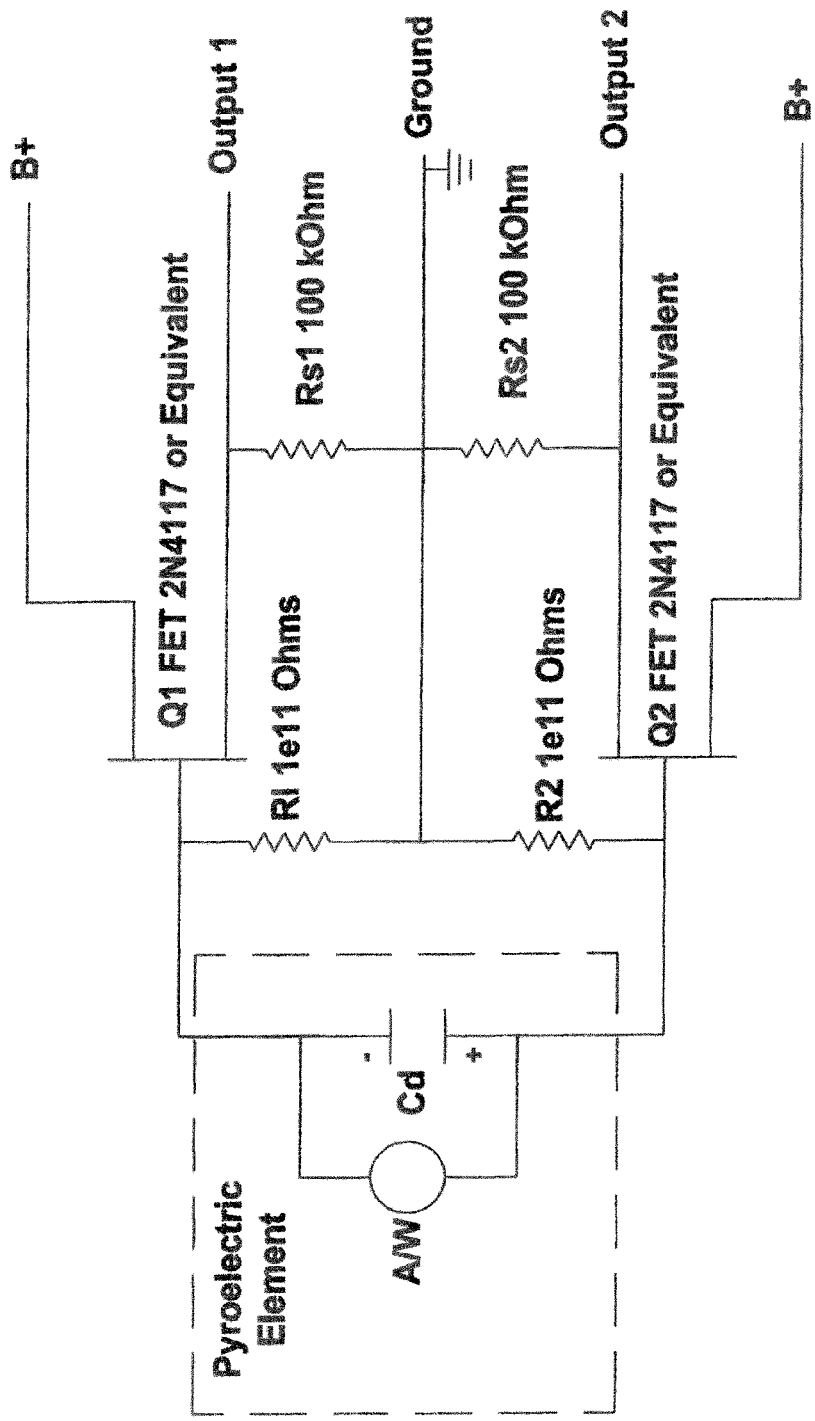
FIG. 1 is an electrical schematic of the circuit for the differential pyroelectric infrared detector.

Referring to FIG. 1, illustrated is a differential pyroelectric infrared detector circuit formed by connecting a pyroelectric crystal to two separate impedance conversion circuits. The separate circuits derive two low impedance outputs when are then connected to a differential or instrumentation amplifier. The circuit will eliminate electronic perturbations from outside sources such as line frequency interference or notice from an external but nearby oscillator which may be used to operate a microprocessor circuit, and other sources of electronic noise. The two outputs when connected differentially also have an output which is a factor of two greater than a normal standard single ended device, but also only produce noise which is only the square root of 2 or greater. The circuit additionally increased the signal to noise of the detector by a factor of the square root of the increase in signal or by about 1.41 times the standard single ended device.

Figure 2:
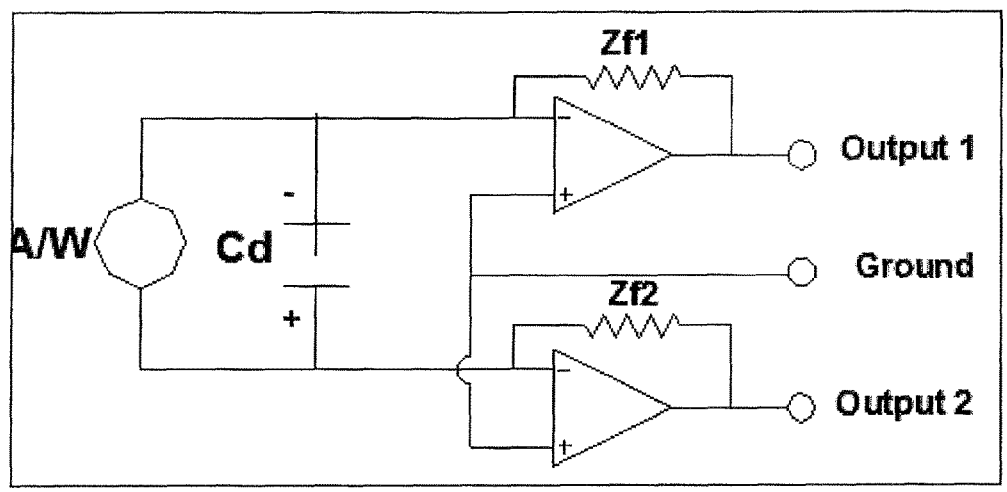
FIG. 2 is an alternative embodiment for the differential pyroelectric infrared detector

FIG. 2 is an alternative embodiment wherein a pair of FET input amplifiers are connected with resistors Zf1 and Zf2 a placed in a parallel combination. In this embodiment, resistors Zf1 and Zf2 have a small capacitance of less than 5 pico Farads and a high ohmic value of resistance of about 100 Giga. Outputs 1 and Output 2, when connected differentially also have an output which is a factor of two greater than a normal standard single ended device, but also only produce noise which is only the square root of 2 or greater. The circuit additionally increased the signal to noise of the detector by a factor of the square root of the increase in signal or by about 1.41 times the standard single ended device.

All patents and publications mentioned in this specification are indicative of the levels of those skilled in the art to which the invention pertains. It is to be understood that while a certain form of the invention is illustrated, it is not to be limited to the specific form or arrangement herein described and shown. It will be apparent to those skilled in the art that various changes may be made without departing from the scope of the invention and the invention is not to be considered limited to what is shown and described in the specification and any drawings/figures included herein.

One skilled in the art will readily appreciate that the present invention is well adapted to carry out the objectives and obtain the ends and advantages mentioned, as well as those inherent therein. The embodiments, methods, procedures and techniques described herein are presently representative of the preferred embodiments, are intended to be exemplary and are not intended as limitations on the scope. Changes therein and other uses will occur to those skilled in the art which are encompassed within the spirit of the invention and are defined by the scope of the appended claims. Although the invention has been described in connection with specific preferred embodiments, it should be understood that the invention as claimed should not be unduly limited to such specific embodiments. Indeed, various modifications of the described modes for carrying out the invention which are obvious to those skilled in the art are intended to be within the scope of the following claims.

What is claimed is:

1. A differential pyroelectric infrared detector circuit comprising:
   a pyroelectric crystal with two electrodes;
   two separate impedance conversion circuits, wherein one impedance conversion circuit is connected to one of the electrodes and the other impedance conversion circuit to another of the electrodes of the pyroelectric crystal, wherein each of the impedance conversion circuit providing a low impedance output;

an amplifier for receipt of each said low impedance output, wherein each of the amplifiers is a source follower, comprising a FET;

wherein said two impedance conversion circuits are connected to a differential amplifier, wherein the differential pyroelectric infrared detector circuit further comprises a primary bridge and a secondary bridge, wherein the primary bridge is coupled to each of the pyroelectric crystal electrodes and wherein said second bridge is coupled to each of amplifier outputs, wherein the primary bridge is formed by a first resistor R1 and a second resistor R2, wherein the first primary bridge is furthermore coupled to the secondary bridge which is formed by a first resistor Rs1 and a second resistor Rs2.

2. The differential pyroelectric infrared detector circuit according to claim 1, wherein each said amplifier comprises a 2N4117 FET.

3. The differential pyroelectric infrared detector circuit according to claim 1 wherein the first resistor R1 of the primary bridge has 1e11 Ohms and the second resistor R2 of the primary bridge has 1e11 Ohms, wherein the first resistor Rs1 of the secondary bridge has 100 KOhms and the second resistor Rs2 of the secondary bridge has 100 KOhms.

4. The differential pyroelectric infrared detector circuit according to claim 1 wherein each said impedance conversion circuit is formed from an amplifier having a resistor bridge, each said resistor having a small capacitance of less than 5 pico Farad and a high ohmic value of resistance of about 100 Giga Ohms.

* * * * *